(12) United States Patent
Wu et al.

(10) Patent No.: US 8,803,246 B2
(45) Date of Patent: Aug. 12, 2014

(54) SEMICONDUCTOR ELECTRONIC COMPONENTS WITH INTEGRATED CURRENT LIMITERS

(75) Inventors: Yifeng Wu, Goleta, CA (US); Umesh Mishra, Montecito, CA (US); Srabanti Chowdhury, Goleta, CA (US)

(73) Assignee: Transphorm Inc., Goleta, CA (US)

(*) Notice: Subject to any disclaimer, the term of this patent is extended or adjusted under 35 U.S.C. 154(b) by 0 days.

(21) Appl. No.: 13/550,445

(22) Filed: Jul. 16, 2012

(65) Prior Publication Data

US 2014/0015066 A1 Jan. 16, 2014

(51) Int. Cl.
*H01L 27/088* (2006.01)

(52) U.S. Cl.
USPC .......................................... 257/392; 257/348

(58) Field of Classification Search
USPC .................................. 257/348, 392
See application file for complete search history.

(56) References Cited

U.S. PATENT DOCUMENTS

| | | | |
|---|---|---|---|
| 4,321,489 A * | 3/1982 | Higuchi et al. | 327/76 |
| 4,384,287 A | 5/1983 | Sakuma | |
| 4,665,508 A * | 5/1987 | Chang | 365/208 |
| 4,728,826 A | 3/1988 | Einzinger et al. | |
| 4,808,853 A | 2/1989 | Taylor | |
| 5,198,964 A | 3/1993 | Ito et al. | |
| 5,329,147 A | 7/1994 | Vo et al. | |
| 5,379,209 A | 1/1995 | Goff | |
| 5,493,487 A | 2/1996 | Close et al. | |
| 5,637,922 A | 6/1997 | Fillion et al. | |
| 5,714,393 A | 2/1998 | Wild et al. | |
| 5,952,856 A | 9/1999 | Horiguchi et al. | |
| 6,008,684 A | 12/1999 | Ker et al. | |
| 6,097,046 A | 8/2000 | Plumton | |
| 6,107,844 A | 8/2000 | Berg et al. | |
| 6,130,831 A | 10/2000 | Matsunaga | |
| 6,172,550 B1 | 1/2001 | Gold et al. | |
| 6,333,617 B1 | 12/2001 | Itabashi et al. | |
| 6,395,593 B1 | 5/2002 | Pendharkar et al. | |
| 6,521,940 B1 | 2/2003 | Vu et al. | |

(Continued)

FOREIGN PATENT DOCUMENTS

| | | |
|---|---|---|
| CN | 1748320 | 3/2006 |
| CN | 101107713 | 1/2008 |

(Continued)

OTHER PUBLICATIONS

Authorized officer Keon Hyeong Kim, International Search Report and Written Opinion in PCT/US2008/076160 mailed Mar. 18, 2009, 11 pp.

(Continued)

*Primary Examiner* — David Vu
*Assistant Examiner* — Brandon Fox
(74) *Attorney, Agent, or Firm* — Fish & Richardson P.C.

(57) ABSTRACT

An electronic component includes a high-voltage depletion-mode transistor and a low-voltage enhancement-mode transistor. A source electrode of the high-voltage depletion-mode transistor is electrically connected to a drain electrode of the low-voltage enhancement-mode transistor, and a gate electrode of the high-voltage depletion-mode transistor is electrically coupled to the source electrode of the low-voltage enhancement-mode transistor. The on-resistance of the enhancement-mode transistor is less than the on-resistance of the depletion-mode transistor, and the maximum current level of the enhancement-mode transistor is smaller than the maximum current level of the depletion-mode transistor.

32 Claims, 9 Drawing Sheets

(56) References Cited

U.S. PATENT DOCUMENTS

| | | |
|---|---|---|
| 6,650,169 B2 | 11/2003 | Faye et al. |
| 6,781,423 B1 | 8/2004 | Knoedgen |
| 6,900,657 B2 | 5/2005 | Bui et al. |
| 6,979,863 B2 | 12/2005 | Ryu |
| 7,116,567 B2 | 10/2006 | Shelton et al. |
| 7,304,331 B2 | 12/2007 | Saito et al. |
| 7,378,883 B1 | 5/2008 | Hsueh |
| 7,443,648 B2 | 10/2008 | Cutter et al. |
| 7,477,082 B2 | 1/2009 | Fukazawa |
| 7,501,669 B2 | 3/2009 | Parikh et al. |
| 7,548,112 B2 | 6/2009 | Sheppard |
| 7,612,602 B2 | 11/2009 | Yang et al. |
| 7,639,064 B2 | 12/2009 | Hsiao et al. |
| 7,719,055 B1 | 5/2010 | McNutt et al. |
| 7,746,020 B2 | 6/2010 | Schnetzka et al. |
| 7,804,328 B2 | 9/2010 | Pentakota et al. |
| 7,851,825 B2 | 12/2010 | Suh et al. |
| 7,875,907 B2 | 1/2011 | Honea et al. |
| 7,875,914 B2 | 1/2011 | Sheppard |
| 7,915,643 B2 | 3/2011 | Suh et al. |
| 7,920,013 B2 | 4/2011 | Sachdev et al. |
| 7,948,011 B2 | 5/2011 | Rajan et al. |
| 7,965,126 B2 | 6/2011 | Honea et al. |
| 8,013,580 B2 | 9/2011 | Cervera et al. |
| 2002/0125920 A1 | 9/2002 | Stanley |
| 2003/0178654 A1 | 9/2003 | Thornton |
| 2004/0041169 A1 | 3/2004 | Ren et al. |
| 2004/0178831 A1 | 9/2004 | Li et al. |
| 2005/0052221 A1 | 3/2005 | Kohnotoh et al. |
| 2005/0067716 A1 | 3/2005 | Mishra et al. |
| 2005/0077947 A1 | 4/2005 | Munzer et al. |
| 2005/0146310 A1 | 7/2005 | Orr |
| 2005/0189561 A1 | 9/2005 | Kinzer et al. |
| 2005/0189562 A1 | 9/2005 | Kinzer et al. |
| 2005/0218964 A1 | 10/2005 | Oswald et al. |
| 2006/0033122 A1 | 2/2006 | Pavier et al. |
| 2006/0043499 A1 | 3/2006 | De Cremoux et al. |
| 2006/0060871 A1 | 3/2006 | Beach |
| 2006/0102929 A1 | 5/2006 | Okamoto et al. |
| 2006/0176007 A1 | 8/2006 | Best |
| 2006/0237825 A1 | 10/2006 | Pavier et al. |
| 2006/0238234 A1 | 10/2006 | Benelbar et al. |
| 2006/0261473 A1 | 11/2006 | Connah et al. |
| 2007/0018210 A1 | 1/2007 | Sheppard |
| 2007/0080672 A1 | 4/2007 | Yang |
| 2007/0090373 A1 | 4/2007 | Beach et al. |
| 2007/0146045 A1 | 6/2007 | Koyama |
| 2007/0224710 A1 | 9/2007 | Palacios et al. |
| 2007/0278518 A1 | 12/2007 | Chen et al. |
| 2008/0017998 A1 | 1/2008 | Pavio |
| 2008/0018366 A1 | 1/2008 | Hanna |
| 2008/0122418 A1 | 5/2008 | Briere et al. |
| 2008/0136390 A1 | 6/2008 | Briere |
| 2008/0158110 A1 | 7/2008 | Iida et al. |
| 2008/0191342 A1 | 8/2008 | Otremba |
| 2008/0203559 A1 | 8/2008 | Lee et al. |
| 2008/0230784 A1 | 9/2008 | Murphy |
| 2008/0248634 A1 | 10/2008 | Beach |
| 2008/0272404 A1 | 11/2008 | Kapoor |
| 2008/0283844 A1 | 11/2008 | Hoshi et al. |
| 2008/0308813 A1 | 12/2008 | Suh et al. |
| 2009/0072269 A1 | 3/2009 | Suh et al. |
| 2009/0167411 A1 | 7/2009 | Machida et al. |
| 2009/0180304 A1 | 7/2009 | Bahramian et al. |
| 2009/0201072 A1 | 8/2009 | Honea et al. |
| 2009/0215230 A1 | 8/2009 | Muto et al. |
| 2009/0236728 A1 | 9/2009 | Satou et al. |
| 2009/0278513 A1 | 11/2009 | Bahramian et al. |
| 2009/0315594 A1 | 12/2009 | Pentakota et al. |
| 2010/0067275 A1 | 3/2010 | Wang et al. |
| 2010/0073067 A1 | 3/2010 | Honea |
| 2010/0097119 A1 | 4/2010 | Ma et al. |
| 2010/0117095 A1 | 5/2010 | Zhang |
| 2011/0019450 A1 | 1/2011 | Callanan et al. |
| 2011/0025397 A1 | 2/2011 | Wang et al. |
| 2011/0121314 A1 | 5/2011 | Suh et al. |
| 2011/0169549 A1 | 7/2011 | Wu |
| 2011/0181218 A1 | 7/2011 | Tsuchiya |
| 2011/0193619 A1 | 8/2011 | Parikh et al. |
| 2011/0227095 A1* | 9/2011 | Treu et al. ............ 257/77 |
| 2012/0112793 A1 | 5/2012 | Spits et al. |
| 2012/0153390 A1* | 6/2012 | Mishra et al. ............ 257/339 |
| 2012/0161246 A1 | 6/2012 | Yamaji et al. |

FOREIGN PATENT DOCUMENTS

| | | |
|---|---|---|
| CN | 101312207 | 11/2008 |
| CN | 101897029 | 11/2010 |
| CN | 101978589 | 2/2011 |
| CN | 102017160 | 4/2011 |
| CN | 102165694 | 8/2011 |
| CN | 102308387 | 1/2012 |
| CN | 103477543 | 12/2013 |
| CN | 103493206 | 1/2014 |
| EP | 1 998 376 | 12/2008 |
| EP | 2 188 842 | 5/2010 |
| EP | 2 243 213 | 10/2010 |
| JP | 5-075040 | 3/1993 |
| JP | 6-067744 | 3/1994 |
| JP | 11-224950 | 8/1999 |
| JP | 2000-058871 | 2/2000 |
| JP | 2000-101356 | 4/2000 |
| JP | 2000-124358 | 4/2000 |
| JP | 2003-229566 | 8/2003 |
| JP | 2003-244943 | 8/2003 |
| JP | 2003-338742 | 11/2003 |
| JP | 2004-260114 | 9/2004 |
| JP | 2004-281454 | 10/2004 |
| JP | 2006-032749 | 2/2006 |
| JP | 2006-033723 | 2/2006 |
| JP | 2006-173754 | 6/2006 |
| JP | 2007-036218 | 2/2007 |
| JP | 2007-215331 | 8/2007 |
| JP | 2007-294769 | 11/2007 |
| JP | 2008-199771 | 8/2008 |
| JP | 2010-087076 | 4/2010 |
| JP | 2010-525023 | 7/2010 |
| JP | 2010-539712 | 12/2010 |
| JP | 2011-512119 | 4/2011 |
| JP | 2012-517699 | 8/2012 |
| TW | 200924068 | 6/2009 |
| TW | 200924201 | 6/2009 |
| TW | 200941920 | 10/2009 |
| TW | 200947703 | 11/2009 |
| TW | 201010076 | 3/2010 |
| TW | 201027759 | 7/2010 |
| TW | 201027912 | 7/2010 |
| TW | 201036155 | 10/2010 |
| TW | 201126686 | 8/2011 |
| TW | 201143017 | 12/2011 |
| TW | 201322443 | 6/2013 |
| WO | WO 2004/070791 | 8/2004 |
| WO | WO 2004/098060 | 11/2004 |
| WO | WO 2005/070007 | 8/2005 |
| WO | WO 2005/070009 | 8/2005 |
| WO | WO 2006/114883 | 11/2006 |
| WO | WO 2007/077666 | 7/2007 |
| WO | WO 2007/108404 | 9/2007 |
| WO | WO 2008/120094 | 10/2008 |
| WO | WO 2009/036181 | 3/2009 |
| WO | WO 2009/036266 | 3/2009 |
| WO | WO 2009/039028 | 3/2009 |
| WO | WO 2009/039041 | 3/2009 |
| WO | WO 2009/076076 | 6/2009 |
| WO | WO 2009/102732 | 8/2009 |
| WO | WO 2009/132039 | 10/2009 |
| WO | WO 2010/039463 | 4/2010 |
| WO | WO 2010/068554 | 6/2010 |
| WO | WO 2010/090885 | 8/2010 |
| WO | WO 2010/132587 | 11/2010 |
| WO | WO 2011/031431 | 3/2011 |
| WO | WO 2011/053981 | 5/2011 |
| WO | WO 2011/072027 | 6/2011 |

(56) References Cited

FOREIGN PATENT DOCUMENTS

| WO | WO 2011/085260 | 7/2011 |
|---|---|---|
| WO | WO 2011/097302 | 8/2011 |
| WO | WO 2013/052833 | 4/2013 |

OTHER PUBLICATIONS

Authorized officer Simin Baharlou, International Preliminary Report on Patentability in PCT/US2008/076160, mailed Mar. 25 2010, 6 pp.
Authorized officer Jae Woo Wee, International Search Report and Written Opinion in PCT/US2009/033699, mailed Sep. 21, 2009, 11 pp.
Authorized officer Dorothée Mülhausen, International Preliminary Report on Patentability in PCT/US2009/033699, mailed Aug. 26, 2010, 6 pp.
Authorized officer Sung Hee Kim, International Search Report and the Written Opinion in PCT/US2009/057554, mailed May 10, 2010, 13 pp.
Authorized Officer Gijsbertus Beijer, International Preliminary Report on Patentability in PCT/US2009/057554, mailed Mar. 29, 2011, 7 pp.
Authorized officer Sung Chan Chung, International Search Report and Written Opinion for PCT/US2010/021824, mailed Aug. 23, 2010, 9 pp.
Authorized officer Beate Giffo-Schmitt, International Preliminary Report on Patentability in PCT/US2010/021824, mailed Aug. 23, 2010, 6 pp.
Authorized officer Bon Gyoung Goo, International Search Report and Written Opinion in PCT/US2010/055129, mailed Jul. 1, 2011, 11 pp.
Authorized officer Yolaine Cussac, International Preliminary Report on Patentability in PCT/US2010/055129, mailed May 18, 2012, 6 pp.
Authorized officer Kee Young Park, International Search Report and Written Opinion in PCT/US2011/023485, mailed Sep. 23 2011, 10 pp.
Authorized officer Nora Lindner, International Preliminary Report on Patentability in PCT/US2011/023485, mailed Aug. 16, 2012, 7 pages.
Authorized officer Sung Joon Lee, International Search Report and Written Opinion in PCT/US2011/020592, mailed Sep. 19, 2011, 9 pages.
Authorized officer Philippe Bécamel, International Preliminary Report on Patentability in PCT/US2011/020592, mailed Jul. 19, 2012, 7 pages.
Authorized officer Kwak In Gu, International Search Report and Written Opinion in PCT/US2012/026810, mailed Jan. 23, 2013, 10 pages.
Chen, et al., "Single-Chip Boost Converter Using Monolithically Integrated AlGan/GaN Lateral Field-Effect Rectifier and Normally Off HEMT," IEEE Electron Device Letters, May 2009, 30(5):430-432.
Napierala et al. (2006), "Selective GaN Epitaxy on Si(111) Substrates Using Porous Aluminum Oxide Buffer Layers," Journal of the Electrochemical Society, 153(2):G125-G127, 4 pages.
Search Report and Action in TW Application No. 098132132, issued Dec. 6, 2012, 8 pages.
Wu et al., "A 97.8% Efficient GaN HEMT Boost Converter with 300-W Output Power at 1MHz," Aug. 2008, Electronic Device Letters, IEEE, 29(8):824-826.
Authorized officer Chung Keun Lee, International Search Report and Written Opinion in PCT/US2008/076030, mailed Mar. 23, 2009, 10 pages.
Authorized officer Yolaine Cussac, International Preliminary Report on Patentability in PCT/US2008/076030, mailed Mar. 25, 2010, 5 pages.
Authorized officer Chung Keun Lee, International Search Report and Written Opinion in PCT/US2008/076079, mailed Mar. 20, 2009, 11 pages.
Authorized officer Nora Lindner, International Preliminary Report on Patentability in PCT/US2008/076079, mailed Apr. 1, 2010, 6 pages.
Authorized officer Chung Keun Lee, International Search Report and Written Opinion in PCT/US2008/076199, mailed Mar. 24, 2009, 11 pages.
Authorized officer Dorothée Mülhausen, International Preliminary Report on Patentability in PCT/US2008/076199, mailed Apr. 1, 2010, 6 pages.
Authorized officer Keon Hyeong Kim, International Search Report and Written Opinion in PCT/US2008/085031, mailed Jun. 24, 2009, 11 pages.
Authorized officer Yolaine Cussac, International Preliminary Report on Patentability in PCT/US2008/085031, mailed Jun. 24, 2010, 6 pages.
Authorized officer Tae Hoon Kim, International Search Report and Written Opinion in PCT/US2009/041304, mailed Dec. 18, 2009, 13 pages.
Authorized officer Dorothée Mülhausen, International Preliminary Report on Patentability in PCT/US2009/041304, mailed Nov. 4, 2010, 8 pages.
Authorized officer Cheon Whan Cho, International Search Report and Written Opinion in PCT/US2009/066647, mailed Jul. 1, 2010, 16 pages.
Authorized officer Athina Nickitas-Etienne, International Preliminary Report on Patentability in PCT/US2009/066647, mailed Jun. 23, 2011, 12 pages.
Authorized officer Sang Ho Lee, International Search Report and Written Opinion in PCT/US2010/034579, mailed Dec. 24, 2010, 9 pages.
Authorized officer Nora Lindner, International Preliminary Report on Patentability in PCT/US2010/034579, mailed Nov. 24, 2011, 6 pages.
Authorized officer Jeongmin Choi, International Search Report and Written Opinion in PCT/US2010/046193, mailed Apr. 26, 2011, 13 pages.
Authorized officer Philippe Bécamel, International Preliminary Report on Patentability in PCT/US2010/046193, mailed Mar. 8, 2012, 10 pages.
Authorized officer Sang Ho Lee, International Search Report and Written Opinion in PCT/US2010/059486, mailed Jul. 26, 2011, 9 pages.
Authorized officer Nora Lindner, International Preliminary Report on Patentability in PCT/US2010/059486, mailed Jun. 21, 2012, 6 pages.
Authorized officer Sang-Taek Kim, International Search Report and Written Opinion in PCT/US2011/061407, mailed May 22, 2012, 10 pages.
Authorized officer Lingfei Bai, International Preliminary Report on Patentability in PCT/US2011/061407, mailed Jun. 6, 2013, 7 pages.
Authorized officer Kwan Sik Sul, International Search Report and Written Opinion in PCT/US2011/063975, mailed May 18, 2012, 8 pages.
Authorized officer Simin Baharlou, International Preliminary Report on Patentability in PCT/US2011/063975, mailed Jun. 27, 2013, 5 pages.
Authorized officer Kwan Sik Sul, International Search Report and Written Opinion in PCT/US2012/023160, mailed May 24, 2012, 9 pages.
Authorized officer Simin Baharlou, International Preliminary Report on Patentability in PCT/US2012/023160, mailed Aug. 15, 2013, 6 pages.
Authorized officer Lingfei Bai, International Preliminary Report on Patentability in PCT/US2012/026810, mailed Sep. 12, 2013, 6 pages.
Authorized officer Jeongmin Choi, International Search Report and Written Opinion in PCT/US2012/027146, mailed Sep. 24, 2012, 12 pages.
Authorized officer Athina Nickitas-Etienne, International Preliminary Report on Patentability in PCT/US2012/027146, mailed Sep. 19, 2013, 9 pages.
Authorized officer Tae Hoon Kim, International Search Report and Written Opinion in PCT/US2013/035837, mailed Jul. 30, 2013, 9 pages.

(56) References Cited

OTHER PUBLICATIONS

Authorized officer Hye Lyun Park, International Search Report and Written Opinion in PCT/US2013/050914, mailed Oct. 18, 2013, 11 pages.
Authorized officer Tae Hoon Kim, International Search Report and Written Opinion in PCT/US2013/050722, mailed Jan. 13, 2014, 10 pages.
European Search Report in EP 10 81 5813.0, mailed Mar. 12, 2013, 9 pages.
SIPO First Office Action for Application No. 200880120050.6, issued Aug. 2, 2011, 10 pages.
SIPO First Office Action for Application No. 200980114639.X, issued May 14, 2012, 13 pages.
Ando et al., "10-W/mm AlGaN-GaN HFET with Field Modulating Plate," IEEE Electron Device Letters, 2003, 24(5):289-291.
Arulkumaran et al., "Surface Passivation Effects on AlGaN/GaN High-electron-mobility Transistors with $SiO_2$, $Si_3N_4$, and Silicon Oxynitride," Applied Physics Letters, 2004, 84(4):613-615.
Chen et al., "High-performance AlGaN/GaN Lateral Field-effect Rectifiers Compatible with High Electron Mobility Transistors," Applied Physics Letters, 2008, 92:253501-1-3.
Coffie, "Characterizing and Suppressing DC-to-RC Dispersion in AlGaN/GaN High Electron Mobility Transistors," 2003, Dissertation, University of California, Santa Barbara, 169 pages.
Coffie et al., "Unpassivated p-GaN/AlGaN/GaN HEMTs with 7.1 W/mm at 10 GHz," Electronics Letters, 2003, 39(19):1419-1420.
Chu et al., "1200-V Normally Off GaN-on-Si Field-effect Transistors with Low Dynamic On-resistance," 2011, IEEE Electron Device Letters, 32(5):632-634.
Dora et al., "High Breakdown Voltage Achieved on AlGaN/GaN HEMTs with Integrated Slant Field Plates," IEEE Electron Device Letters, 2006, 27(9):713-715.
Dora et al., "$ZrO_2$ Gate Dielectrics Produced by Ultraviolet Ozone Oxidation for GaN and AlGaN/GaN Transistors," J. Vac. Sci. Technol. B, 2006, 24(2):575-581.
Dora, "Understanding Material and Process Limits for High Breakdown Voltage AlGaN/GaN HEMTs," 2006, Dissertation, University of California, Santa Barbara, 157 pages.
Fanciulli et al., "Structural and Electrical Properties of $HfO_2$ Films Grown by Atomic Layer Deposition on Si, Ge, GaAs and GaN," Mat. Res. Soc. Symp. Proc., 2004, 786:E6.14.1-6.
Green et al., "The Effect of Surface Passivation on the Microwave Characteristics of Undoped AlGaN/GaN HEMTs," IEEE Electron Device Letters, 2000, 21(6):268-270.
Gu et al., "AlGaN/GaN MOS Transistors Using Crystalline $ZrO_2$ as Gate Dielectric," Proc. of SPIE, 2007, 6473:64730S-1-8.
Higashiwaki et al., "AlGaN/GaN Heterostructure Filed-effect Transistors on 4H-SiC Substrates with Current-gain Cutoff Frequency of 190 GHz," Applied Physics Express, 2008, 1:021103-1-3.
Hwang et al., "Effects of a Molecular Beam Epitaxy Grown AlN Passivation Layer on AlGaN/GaN Heterojunction Field Effect Transistors," Solid-State Electronics, 2004, 48:363-366.
Im et al., "Normally Off GaN MOSFET Based on AlGaN/GaN Heterostructure with Extremely High 2DEG Density Grown on Silicon Substrate," IEEE Electron Device Letters, 2010, 31(3):192-194.
Karmalkar and Mishra, "Enhancement of Breakdown Voltage in AlGaN/GaN High Electron Mobility Transistors Using a Field Plate," IEEE Transactions on Electron Devices, 2001, 48(8):1515-1521.
Karmalkar and Mishra, "Very High Voltage AlGaN/GaN High Electron Mobility Transistors Using a Filed Plate Deposited on a Stepped Insulator," Solid-State Electronics, 2001, 45:1645-1652.
Keller et al., "GaN-GaN Junctions with Ultrathin AlN Interlayers: Expanding Heterojunction Design," Applied Physics Letters, 2002, 80(23):4387-4389.
Keller et al, "Method for Heteroepitaxial Growth of High-quality N-face GaN, InN, and AlN and their Alloys by Metal Organic Chemical Vapor Deposition," U.S. Appl. No. 60/866,035, filed Nov. 15, 2006, 31 pages.

Khan et al., "AlGaN/GaN Metal Oxide Semiconductor Heterostructure Field Effect Transistor," IEEE Electron Device Letters, 2000, 21(2):63-65.
Kim, Process Development and Device Characteristics of AlGaN/GaN HEMTs for High Frequency Applications, 2007, Dissertation, University of Illinois, Urbana-Champaign, 120 pages.
Kumar et al., "High Transconductance Enhancement-mode AlGaN/GaN HEMTs on SiC Substrate," Electronics Letters, 2003, 39(24):1758-1760.
Kuraguchi et al., "Normally-off GaN-MISFET with Well-controlled Threshold Voltage," Phys. Stat. Sol., 2007, 204(6):2010-2013.
Lanford et al., "Recessed-gate Enhancement-mode GaN HEMT with High Threshold Voltage," Electronics Letters, 2005, vol. 41, No. 7, 2 pages.
Lee et al., "Self-aligned Process for Emitter- and Base-regrowth GaN HBTs and BJTs," Solid-State Electronics, 2001, 45:243-247.
Mishra et al., "N-face High Electron Mobility Transistors with Low Buffer Leakage and Low Parasitic Resistance," U.S. Appl. No. 60/908,914, filed Mar. 29, 2007, 21 pages.
Mishra et al., "Polarization-induced Barriers for N-face Nitride-based Electronics," U.S. Appl. No. 60/940,052, filed May 24, 2007, 29 pages.
Mishra et al., "Growing N-polar III-nitride Structures," U.S. Appl. No. 60/972,467, filed Sep. 14, 2007, 7 pages.
Mishra et al., "AlGaN/GaN HEMTs—an Overview of Device Operation and Applications," Proceedings of the IEEE, 2002, 90(6):1022-1031.
Nanjo et al., "Remarkable Breakdown Voltage Enhancement in AlGaN Channel High Electron Mobility Transistors," Applied Physics Letters, 2008, 92:263502-1-3.
Ota and Nozawa, "AlGaN/GaN Recessed MIS-gate HFET with High-threshold-voltage Normally-off Operation for Power Electronics Applications," IEEE Electron Device Letters, 2008, 29(7):668-670.
Palacios et al., "AlGaN/GaN HEMTs with an InGaN-based Back-barrier," IEEE 63rd Device Research Conference Digest, 2005, pp. 181-182.
Palacios et al., "AlGaN/GaN High Electron Mobility Transistors with InGaN Back-barriers," IEEE Electron Device Letters, 2006, 27(1):13-15.
Palacios et al., "Nitride-based High Electron Mobility Transistors with a GaN Spacer," Applied Physics Letters, 2006, 89:073508-1-3.
Palacios et al., "Fluorine Treatment to Shape the Electric Field in Electron Devices, Passivate Dislocations and Point Defects, and Enhance the Luminescence Efficiency of Optical Devices," U.S. Appl. No. 60/736,628, filed Nov. 15, 2005, 21 pages.
Pei et al., "Effect of Dielectric Thickness on Power Performance of AlGaN/GaN HEMTs," IEEE Electron Device Letters, 2009, 30(4):313-315.
Rajan et al., "Advanced Transistor Structures Based on N-face GaN," 32M International Symposium on Compound Semiconductors (ISCS), Sep. 18-22, 2005, Europa-Park Rust, Germany, 2 pages.
Saito et al., "Recessed-gate Structure Approach Toward Normally off High-voltage AlGaN/GaN HEMT for Power Electronics Applications," IEEE Transactions on Electron Devices, 2006, 53(2):356-362.
Shen, "Advanced Polarization-based Design of AlGaN/GaN HEMTs," 2004, Dissertation, University of California, Santa Barbara, 192 pages.
Shelton et al., "Selective Area Growth and Characterization of AlGaN/GaN Heterojunction Bipolar Transistors by Metalorganic Chemical Vapor Deposition," IEEE Transactions on Electron Devices, 2001, 48(3):490-494.
"Planar, Low Switching Loss, Gallium Nitride Devices for Power Conversion Applications," Navy SBIR, 2012, 3 pages.
Sugiura et al., "Enhancement-mode n-channel GaN MOSFETs Fabricated on p-GaN using $HfO_2$ as Gate Oxide," Electronics Letters, 2007, vol. 43, No. 17, 2 pages.
Suh et al., "High-breakdown Enhancement-mode AlGaN/GaN HEMTs with Integrated Slant Field-plate," International Electron Devices Meeting (IEDM), 2006, 3 pages.
Suh et al., "High Breakdown Enhancement Mode GaN-based HEMTs with Integrated Slant Field Plate," U.S. Appl. No. 60/822,886, filed Aug. 18, 2006, 16 pages.

(56) References Cited

OTHER PUBLICATIONS

Suh et al., "III-nitride Devices with Recessed Gates," U.S. Appl. No. 60/972,481, filed Sep. 14, 2007, 18 pages.
Tipirneni et al., "Silicon Dioxide-encapsulated High-voltage AlGaN/GaN HFETs for Power-switching applications," IEEE Electron Device Letters, 2007, 28(9):784-786.
Vetury et al., "Direct Measurement of Gate Depletion in High Breakdown (405V) AlGaN/GaN Heterostructure Field Effect Transistors," 1998, IEDM, pp. 55-58.
Wang et al., "Comparison of the Effect of Gate Dielectric Layer on 2DEG Carrier Concentration in Strained AlGaN/GaN Heterostructure," Mater. Res. Soc. Symp. Proc., 2005, 831:E8.20.1-6.
Wang et al, "Enhancement-mode $Si_3N_4$/AlGaN/GaN/MISHFETs," IEEE Electron Device Letters, 2006, 27(10):793-795.
Wu, "AlGaN/GaN Microwave Power High-mobility-transistors," 1997, Dissertation, University of California, Santa Barbara, 134 pages.
Yoshida, "AlGaN/GaN Power FET," Furukawa Review, 2002, 21:7-11.
Zhang, "High Voltage GaN HEMTs with Low On-resistance for Switching Applications," 2002, Dissertation, University of California, Santa Barbara, 166 pages.
Zhanghong Content, Shanghai Institute of Metallurgy, Chinese Academy of Sciences, "Two-dimensional Electron Gas and High Electron Mobility Transistor (HEMT)," Dec. 31, 1984, 17 pages.
U.S. Appl. No. 13/040,524, filed Mar. 4, 2011, Semiconductor Diodes with Low Reverse Bias Currents.
U.S. Appl. No. 13/040,940, filed Mar. 4, 2011, Electrode Configurations for Semiconductor Devices.
U.S. Appl. No. 61/447,519, filed Feb. 28, 2011, Electronic Components with Reactive Filters.
U.S. Appl. No. 13/403,813, filed Feb. 23, 2012, Electronic Components with Reactive Filters.
U.S. Appl. No. 61/568,022, filed Dec. 7, 2011, Semiconductor Modules and Methods of Forming the Same.
U.S. Appl. No. 13/690,103, filed Nov. 30, 2012, Semiconductor Modules and Methods of Forming the Same.
U.S. Appl. No. 13/366,090, filed Feb. 3, 2012, Buffer Layer Structures Suited for III-Nitride Devices with Foreign Substrates.
U.S. Appl. No. 13/405,041, filed Feb. 24, 2012, Semiconductor Power Modules and Devices.
U.S. Appl. No. 14/134,878, filed Dec. 19, 2013, Semiconductor Power Modules and Devices.
U.S. Appl. No. 61/621,956, filed Apr. 9, 2012, N-Polar III-Nitride Transistors.
U.S. Appl. No. 13/859,635, filed Apr. 9, 2013, N-Polar III-Nitride Transistors.
U.S. Appl. No. 61/765,635, filed Feb. 15, 2013, Electrodes for Semiconductor Devices and Methods of Forming the Same.
U.S. Appl. No. 61/791,395, filed Mar. 15, 2013, Carbon Doping Semiconductor Devices.
U.S. Appl. No. 13/799,989, filed Mar. 13, 2013, Enhancement-Mode III-Nitride Devices.
U.S. Appl. No. 61/807,258, filed Apr. 1, 2013, Gate Drivers for Circuits Based on Semiconductor Devices.

\* cited by examiner

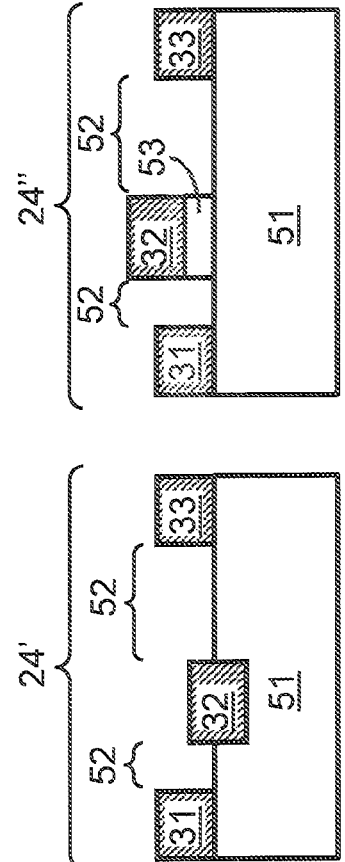
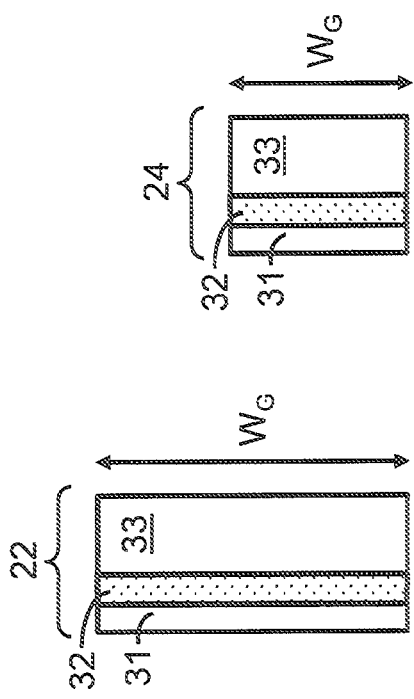
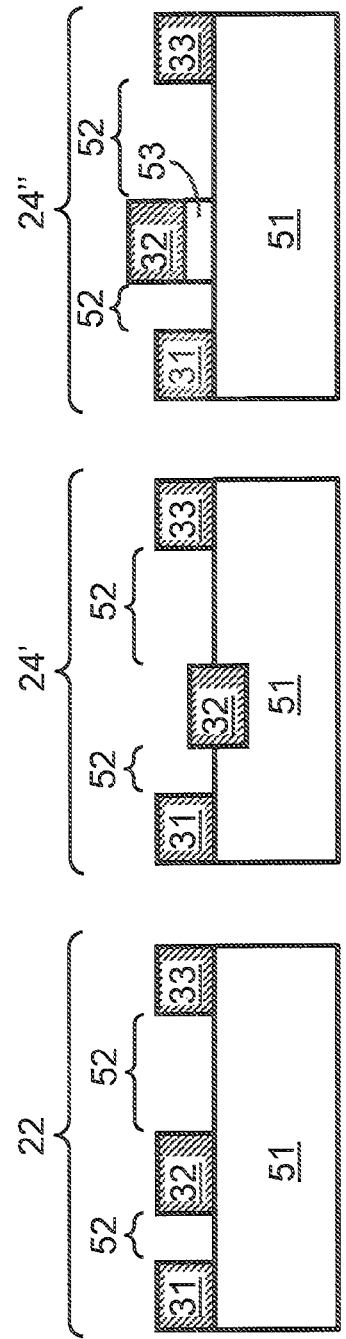

SEMICONDUCTOR ELECTRONIC COMPONENTS WITH INTEGRATED CURRENT LIMITERS

TECHNICAL FIELD

Semiconductor electronic devices and components which include integrated current limiters are described.

BACKGROUND

To date, most transistors used in power electronic applications have typically been fabricated with silicon (Si) semiconductor materials. Common transistor devices for power applications include Si CoolMOS, Si Power MOSFETs, and Si Insulated Gate Bipolar Transistors (IGBTs). While Si power devices are inexpensive, they suffer from a number of disadvantages, including relatively low switching speeds and high levels of electrical noise. More recently, silicon carbide (SiC) power devices have been considered due to their superior properties. III-N semiconductor devices, such as gallium nitride (GaN) devices, are now emerging as attractive candidates to carry large currents, support high voltages and to provide very low on-resistance and fast switching times.

Most conventional III-N high electron mobility transistors (HEMTs) and related transistor devices are normally on, i.e., have a negative threshold voltage, which means that they can conduct current at zero gate voltage. These devices with negative threshold voltages are known as depletion-mode (D-mode) devices. It is preferable in power electronics to have normally off devices, i.e., devices with positive threshold voltages, that do not conduct substantial current at zero gate voltage, in order to avoid damage to the device or to other circuit components by preventing accidental turn on of the device. Normally off devices are commonly referred to as enhancement-mode (E-mode) devices.

Reliable fabrication and manufacturing of high-voltage III-N E-mode transistors has thus far proven to be very difficult. One alternative to a single high-voltage E-mode transistor is to combine a high-voltage D-mode transistor with a low-voltage E-mode transistor in the configuration 1 of FIG. 1 to form a hybrid device, which can be operated in the same way as a single high-voltage E-mode transistor and in many cases achieves the same or similar output characteristics as a single high-voltage E-mode transistor 2, shown in FIG. 2. The hybrid device 1 of FIG. 1 includes a high-voltage D-mode transistor 23 and a low-voltage E-mode transistor 22 which optionally can both be encased in a package 10, the package including a source lead 11, a gate lead 12, and a drain lead 13. The source electrode 31 of the low-voltage E-mode transistor 22 and the gate electrode 35 of the high-voltage D-mode transistor 23 are both electrically connected together and can be electrically connected to the source lead 11. The gate electrode 32 of the low-voltage E-mode transistor 22 can be electrically connected to the gate lead 12. The drain electrode 36 of the high-voltage D-mode transistor 23 can be electrically connected to the drain lead 13. The source electrode 34 of the high-voltage D-mode transistor 23 is electrically connected to the drain electrode 33 of the low-voltage E-mode transistor 22.

As used herein, two or more contacts or other items such as conductive layers or components are said to be "electrically connected" if they are connected by a material which is sufficiently conducting to ensure that the electric potential at each of the contacts or other items is substantially the same or about the same (i.e., intended to be the same) regardless of bias conditions.

The device 2 of FIG. 2 includes a single high-voltage E-mode transistor 21 which can be encased in the same or a similar package 10 to the hybrid device 1 of FIG. 1. The source electrode 41 of the high-voltage E-mode transistor 21 can be connected to the source lead 11, the gate electrode 42 of the high-voltage E-mode transistor 21 can be connected to the gate lead 12, and the drain electrode 43 of the high-voltage E-mode transistor 21 can be connected to the drain lead 13. The device 1 in FIG. 1 and the device 2 in FIG. 2 are both capable of blocking high voltages between the source lead 11 and drain lead 13 when 0V is applied to the gate lead 12 relative to the source lead 11, and both can conduct current from the source lead 11 to the drain lead 13 when a sufficiently positive voltage is applied to the gate lead 12 relative to the source lead 11.

While there are many conventional applications in which the hybrid device 1 of FIG. 1 can be used in place of the single high-voltage E-mode device 2 of FIG. 2, there are certain applications in which modifications and/or improvements to the structure of the hybrid device 1 are desirable or necessary in order to achieve the desired output and simultaneously maintain adequate device reliability.

SUMMARY

In one aspect, an electronic component which includes a depletion-mode transistor having a first breakdown voltage, a first on-resistance, and a first maximum current level is described. The depletion-mode transistor includes a source electrode, a gate electrode, and a drain electrode. The electronic component further includes an enhancement-mode transistor having a second breakdown voltage, a second on-resistance, and a second maximum current level. The enhancement-mode transistor includes a source electrode, a gate electrode, and a drain electrode, with the source electrode of the depletion-mode transistor being electrically connected to the drain electrode of the enhancement-mode transistor, and the gate electrode of the depletion-mode transistor being electrically coupled to the source electrode of the enhancement-mode transistor. Furthermore, the second on-resistance is less than the first on-resistance, and the second maximum current level is lower than the first maximum current level.

In another aspect, an electronic component which includes a depletion-mode transistor having a first breakdown voltage and a first maximum current level is described. The depletion-mode transistor includes a source electrode, a gate electrode, a drain electrode, a semiconductor material layer, and a channel in the semiconductor material layer. The electronic component further includes an enhancement-mode transistor having a second breakdown voltage and a second maximum current level, the enhancement-mode transistor including a source electrode, a gate electrode, and a drain electrode. The source electrode of the depletion-mode transistor is electrically connected to the drain electrode of the enhancement-mode transistor, and the gate electrode of the depletion-mode transistor is electrically coupled to the source electrode of the enhancement-mode transistor. A conductivity or charge density of the channel is smaller in a gate region of the depletion-mode transistor than in an access region of the depletion-mode transistor when 0V is applied to the gate electrode of the depletion-mode transistor relative to the source electrode of the depletion-mode transistor.

In still another aspect, an electronic component which includes a depletion-mode transistor having a first breakdown voltage and a first maximum current level is described. The depletion-mode transistor includes a source electrode, a gate electrode, a drain electrode, a semiconductor material layer including a gate region between the source and drain and a plurality of access regions on opposite sides of the gate region, and a channel in the semiconductor material layer. The electronic component further includes an enhancement-mode transistor having a second breakdown voltage and a second maximum current level, the enhancement-mode transistor including a source electrode, a gate electrode, and a drain electrode. The source electrode of the depletion-mode transistor is electrically connected to the drain electrode of the enhancement-mode transistor, and the gate electrode of the depletion-mode transistor is electrically coupled to the source electrode of the enhancement-mode transistor. The depletion-mode transistor includes one or more isolation regions in the gate region, the one or more isolation regions being configured to reduce the first maximum current level, as compared to a similar device which lacks the one or more isolation regions, without substantially increasing an access resistance of the depletion-mode transistor. Furthermore, the first maximum current level is smaller than the second maximum current level.

Each of the electronic components described herein can include one or more of the following features. The second breakdown voltage can be smaller than the first breakdown voltage. The depletion-mode transistor can be a high-voltage device and the enhancement-mode transistor can be a low-voltage device. The electronic component can be configured to function substantially similarly to a single high-voltage enhancement-mode transistor. A maximum current level of the electronic component can be about the same as or less than the maximum current level of the enhancement-mode transistor. The on-resistance of the enhancement-mode transistor can be less than half the on-resistance of the depletion-mode transistor. The maximum current level of the enhancement-mode transistor can be less than half the maximum current level of the depletion-mode transistor. The maximum current level of the enhancement-mode transistor can be about 35 Amps or less. The maximum current level of the depletion-mode transistor can be about 60 Amps or more.

The enhancement-mode transistor can be a Silicon device. The depletion-mode transistor can be a III-N device. The enhancement-mode transistor can be a Silicon device or a III-N device. The gate electrode of the depletion-mode transistor can be electrically connected to the source electrode of the enhancement-mode transistor. The enhancement-mode transistor can further comprise a semiconductor material and include a channel-depleting dielectric between the semiconductor material and the gate of the enhancement-mode transistor. The first maximum current level can be smaller than the second maximum current level. The semiconductor material layer of the depletion-mode transistor can be recessed in the gate region.

The one or more isolation regions can contain dopants, and the dopants can be selected from the group consisting of Mg, Al, and Fe. The one or more isolation regions can form a break in the channel. The one or more isolation regions can comprise a recess formed in the gate region of the semiconductor material layer. The recess can be formed through the channel.

In yet another aspect, a method of operating any of the electronic components described herein is described. The method includes applying a positive voltage to the gate electrode of the enhancement-mode transistor, relative to the source electrode of the enhancement-mode transistor, and applying a substantial positive voltage to the drain electrode of the depletion-mode transistor, relative to the source electrode of the enhancement-mode transistor, causing a maximum current level of the electronic component to flow between the source electrode of the enhancement-mode transistor and the drain electrode of the depletion-mode transistor, where the maximum current level of the electronic component is smaller than or equal to the first maximum current level.

Particular embodiments of the subject matter described in this specification can be implemented so as to realize one or more of the following advantages. Compared to some conventional electronic components, the electronic components described herein can have similar voltage blocking capabilities and on-resistances while simultaneously having lower maximum current levels, which can result in the electronic components having longer short-circuit survival times.

DESCRIPTION OF DRAWINGS

FIG. 4 is a plan view of two transistors having different gate widths.

FIGS. 5A-5C are cross-sectional views of transistors.

Like reference symbols in the various drawings indicate like elements.

DETAILED DESCRIPTION

Figure 2:
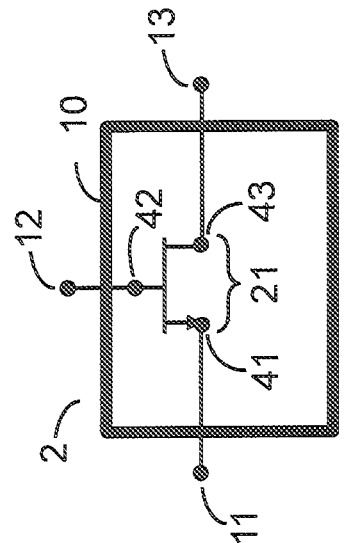
FIG. 2 is a schematic circuit diagram of a transistor device in a package.

Described herein are high-voltage enhancement-mode devices which include integrated current limiters for the purpose of improving device reliability. The devices are hybrid enhancement-mode electronic components which include a high-voltage depletion-mode transistor and a low-voltage enhancement mode transistor. At least one transistor of the device is configured to limit the maximum current that can flow through the device in order to increase the short-circuit survival time of the device, thereby improving reliability of the device.

As used herein, a "hybrid enhancement-mode electronic device or component", or simply a "hybrid device or component", is an electronic device or component formed of a depletion-mode transistor and a enhancement-mode transistor, where the depletion-mode transistor is capable of a higher operating and/or breakdown voltage as compared to the enhancement-mode transistor, and the hybrid device or component is configured to operate similarly to a single enhancement-mode transistor with a breakdown and/or operating voltage about as high as that of the depletion-mode transistor. That is, a hybrid enhancement-mode device or component includes at least 3 nodes having the following properties. When the first node (source node) and second node (gate node) are held at the same voltage, the hybrid enhancement-mode device or component can block a positive high voltage (i.e., a voltage larger than the maximum voltage that the enhancement-mode transistor is capable of blocking) applied to the third node (drain node) relative to the source node. When the gate node is held at a sufficiently positive voltage (i.e., greater than the threshold voltage of the enhancement-mode transistor) relative to the source node, current passes from the source node to the drain node or from the drain node to the source node when a sufficiently positive voltage is applied to the drain node relative to the source node. When the enhancement-mode transistor is a low-voltage device and the depletion-mode transistor is a high-voltage device, the hybrid component can operate similarly to a single high-voltage enhancement-mode transistor. The depletion-mode transistor can have a breakdown and/or maximum operating voltage that is at least two times, at least three times, at least five times, at least ten times, or at least twenty times that of the enhancement-mode transistor.

As used herein, a "high-voltage device", such as a high-voltage transistor, is an electronic device which is optimized for high-voltage switching applications. That is, when the transistor is off, it is capable of blocking high voltages, such as about 300V or higher, about 600V or higher, about 1200V or higher, or about 1700V or higher, and when the transistor is on, it has a sufficiently low on-resistance ($R_{ON}$) for the application in which it is used, i.e., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300V, 600V, 1200V, 1700V, or other suitable blocking voltage required by the application. In other words, a high-voltage device can block any voltage between 0V and at least $V_{max}$, where $V_{max}$ is the maximum voltage that could be supplied by the circuit or power supply. In some implementations, a high-voltage device can block any voltage between 0V and at least $2*V_{max}$. As used herein, a "low-voltage device", such as a low-voltage transistor, is an electronic device which is capable of blocking low voltages, such as between 0V and $V_{low}$ (where $V_{low}$ is less than $V_{max}$), but is not capable of blocking voltages higher than $V_{low}$. In some implementations, $V_{low}$ is equal to about $|V_{th}|$, greater than $|V_{th}|$, about $2*|V_{th}|$, about $3*|V_{th}|$, or between about $|V_{th}|$ and $3*|V_{th}|$, where $|V_{th}|$ is the absolute value of the threshold voltage of a high-voltage transistor, such as a high-voltage-depletion mode transistor, contained within the hybrid component in which a low-voltage transistor is used. In other implementations, $V_{low}$ is about 10V, about 20V, about 30V, about 40V, or between about 5V and 50V, such as between about 10V and 40V. In yet other implementations, $V_{low}$ is less than about $0.5*V_{max}$, less than about $0.3*V_{max}$, less than about $0.1*V_{max}$, less than about $0.05*V_{max}$, or less than about $0.02*V_{max}$.

In typical power switching applications in which high-voltage switching transistors are used, the transistor is at all times in one of two states. In the first state, which is commonly referred to as the "on state", the voltage at the gate electrode relative to the source electrode is higher than the transistor threshold voltage, and substantial current flows through the transistor. In this state, the voltage difference between the source and drain is typically low, usually no more than a few volts, such as about 0.1-5 volts. In the second state, which is commonly referred to as the "off state", the voltage at the gate electrode relative to the source electrode is lower than the transistor threshold voltage, and no substantial current flows through the transistor. In this second state, the voltage between the source and drain can range anywhere from about 0V to the value of the circuit high voltage supply, which in some cases can be as high as 100V, 300V, 600V, 1200V, 1700V, or higher. When the transistor is in the off state, it is said to be "blocking a voltage" between the source and drain. As used herein, "blocking a voltage" refers to the ability of a transistor, device, or component to prevent significant current, such as current that is greater than 0.001 times the operating current during regular conduction, from flowing through the transistor, device, or component when a voltage is applied across the transistor, device, or component. In other words, while a transistor, device, or component is blocking a voltage that is applied across it, the total current passing through the transistor, device, or component will not be greater than 0.001 times the operating current during regular conduction.

In some applications in which high-voltage transistors are used, during failure of the circuit or system, the transistor can be operated in the on state (i.e. conducting current) with a large voltage between the source and drain for short periods of time. During this time, the current flowing through the transistor is the maximum current that the transistor is capable of conducting. This maximum current value is typically referred to as the "short-circuit current" and is represented by the symbol $I_{max}$. For example, in a motor drive circuit, there are times in which the motor can stop turning which are accompanied by a simultaneous large current (i.e., short-circuit current) through the high-voltage transistors in the motor drive circuit and a large voltage across the source and drain terminals of the transistors. The control circuitry which can send a voltage signal to the gate of the transistors to turn the devices off and thereby prevent further current from flowing has a finite response time, typically around 10 microseconds. Hence this high current, high voltage mode of operation is sustained for the entire response time of the control circuitry.

During the high current, high voltage mode of operation described above, the high-voltage transistors and/or other circuit components can become damaged or rendered inoperable. The length of time for which the high current, high voltage mode of operation can be sustained without damaging the high-voltage transistor, known as the "short-circuit survival time" of the high-voltage transistor, is represented by the symbol $\tau$ and given by the equation $\tau = [\Delta T * m * C]/[I_{max}*V]$, where $\Delta T$ is the maximum temperature rise of the transistor before damage is incurred, m is the thermal mass of the transistor (i.e., the mass of material in the vicinity of the transistor channel, such as the mass of the material within about 5 microns of the transistor channel), C is the average thermal capacity of the material in the vicinity of the transistor channel, $I_{max}$ is the maximum current that the transistor is capable of conducting (i.e., the short-circuit current), and V is the average voltage across the transistor during the high current, high voltage mode of operation.

As seen from the equation for $\tau$ above, one way to increase $\tau$ is to decrease the short-circuit current $I_{max}$ without substantially affecting any of the other parameters in the equation for $\tau$. For example, this can be accomplished by designing the transistor with a lower channel charge density and/or lower channel conductivity. However, reduction in $I_{max}$ by this method as well as by many other methods increases the transistor on-resistance $R_{on}$, hence increasing power loss during normal operation. In order to improve reliability without degradation in performance, it is desirable to reduce $I_{max}$ without substantially affecting any of the other parameters in the equation for $\tau$ while only sustaining at most a minimal increase in the on-resistance.

Figure 1:
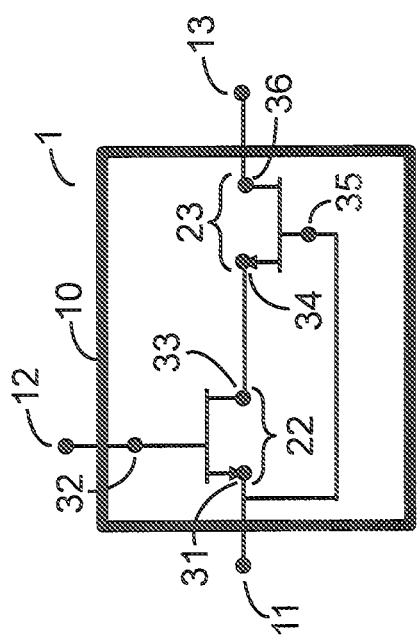
FIG. 1 is a schematic circuit diagram of a hybrid transistor device in a package.

When the hybrid enhancement-mode device 1 of FIG. 1 is used in place of the conventional high-voltage E-mode transistor 2 of FIG. 2, the hybrid device operates as follows. When the hybrid device is in the on state, the current flows through both the channel of the low-voltage E-mode transistor and the channel of the high-voltage D-mode transistor, and the voltage across each of the two transistors is small, typically a few volts or less. When the device is in the off state, the entire voltage being blocked by the hybrid device is divided between the low-voltage E-mode transistor and the high-voltage D-mode transistor as follows. The low-voltage E-mode transistor blocks a voltage approximately equal to $|V_{th}|$, where $V_{th}$ is the absolute value of the threshold voltage of the high-voltage D-mode transistor, and the remainder of the voltage across the hybrid device is blocked by the high-voltage D-mode transistor. $V_{th}$ is typically between about −2V and −10V, while the entire voltage being blocked by the hybrid device can be as high as 300V, 600V, 1200V, 1700V, or higher, so the majority of voltage is blocked by the high-voltage D-mode transistor. During the high current, high voltage mode of operation previously described, a large current flows through the channels of both transistors, the voltage across the low-voltage E-mode transistor is small, typically less than $|V_{th}|$, and a large voltage is sustained across the high-voltage D-mode transistor. The value of the current flowing during this mode of operation cannot exceed the value of $I_{max}$ of either of the two transistors, hence the transistor with the smaller value of $I_{max}$ limits the amount of current that can flow during this mode of operation. Because the voltage across the low-voltage E-mode transistor is much smaller than that across the high-voltage D-mode transistor during this mode of operation, the short-circuit survival time of the low-voltage E-mode transistor is typically much larger than that of the high-voltage D-mode transistor. Hence when a high-voltage hybrid enhancement-mode device is used, the short-circuit survival time of the hybrid device is typically equal to that of the high-voltage D-mode transistor contained within the hybrid device, and so the short-circuit survival time of the high-voltage D-mode transistor should be made as large as possible to improve the reliability of the hybrid device.

In addition to the reliability issues related to short circuit currents described above, further problems with reliability in high power or high voltage semiconductor transistors, and in particular in III-Nitride transistors, can result from holes being generated during device operation. For example, when a semiconductor device such as a transistor is operated in the off state, large electric fields may be present in the material layers, especially when the device is used in high-voltage applications. These large electric fields can result in the creation of holes, such as by impact ionization, in regions in which these electric fields are large. The holes, which have a positive electrical charge, migrate within the device structure towards regions of low electric potential (i.e., low voltage). The presence of these positively charged holes can lead to shifts in the device threshold voltage, reduced reliability, and other undesirable effects. Hence, it is desirable to minimize or eliminate the effects of these holes.

As used herein, the terms III-Nitride or III-N materials, layers, devices, structures, etc., refer to a material, device, or structure comprised of a compound semiconductor material according to the stoichiometric formula $B_w Al_x In_y Ga_z N$, where w+x+y+z is about 1. In a III-Nitride or III-N device, the conductive channel can be partially or entirely contained within a III-N material layer.

Figure 3:
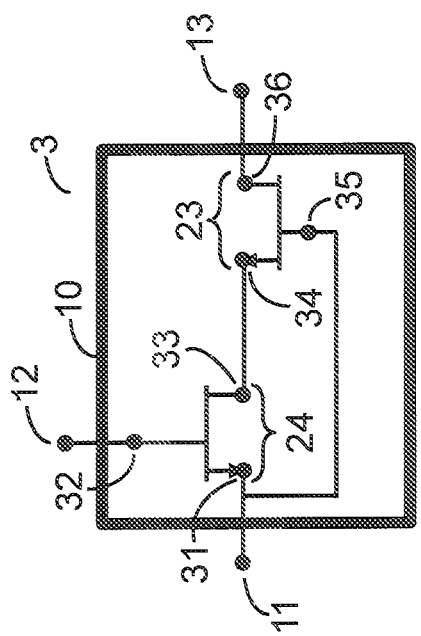
FIG. 3 is a schematic circuit diagram of another hybrid transistor device in a package.

FIG. 3 is a circuit diagram of a hybrid enhancement-mode electronic component 3 in which the maximum current level (i.e. short-circuit current) through the component is limited by the design of the low-voltage enhancement-mode transistor 24. The hybrid enhancement-mode electronic component is a high-voltage device configured to function substantially similarly to a single high-voltage enhancement-mode transistor, as previously described. The hybrid enhancement-mode electronic component 3 of FIG. 3 includes a low-voltage enhancement-mode transistor 24 and a high-voltage depletion-mode transistor 23, connected as follows. The source electrode 34 of the high-voltage depletion-mode transistor is electrically connected to the drain electrode 33 of the low-voltage enhancement-mode transistor, and the gate electrode 35 of the high-voltage depletion-mode transistor is electrically connected to the source electrode of the low-voltage enhancement-mode transistor 31.

The low-voltage enhancement-mode transistor 24 is designed to have a maximum current level (i.e. short-circuit current) that is substantially smaller than that of the high-voltage depletion-mode transistor 23. For example, the maximum current level of the low-voltage enhancement-mode transistor 24 can be less than one half, less than one third, less than one fifth, or less than one tenth that of the high-voltage depletion-mode transistor 23. Hence, the maximum current level (i.e. short-circuit current) through the electronic component is limited by the low-voltage enhancement-mode transistor 24. That is, the maximum current level of the electronic component cannot be larger than that of the low-voltage enhancement-mode transistor 24, and is typically slightly smaller than that of the low-voltage enhancement-mode transistor 24.

The lower maximum current level in the low-voltage enhancement-mode transistor 24, as compared to that of the high-voltage depletion-mode transistor 23, can be achieved in a number of ways. For example a conventional low-voltage enhancement-mode transistor, which may have a maximum current level that is similar to or greater than that of the high-voltage depletion-mode transistor 23, can be modified as follows to produce the low-voltage enhancement-mode transistor 24 of FIG. 3. Referring to FIG. 4, the gate width $W_G$ (i.e., the length of the gate in a direction substantially perpendicular to current flow) of a conventional low-voltage enhancement-mode transistor 22 can be reduced such that the maximum current level of the resulting low-voltage enhancement-mode transistor 24 is substantially less than that of the high-voltage depletion-mode transistor 23.

Alternatively, in cases when the low-voltage enhancement-mode transistor is a field-effect transistor (FET), such as a lateral FET, the charge density in the channel of the enhancement-mode transistor can be made smaller in the gate region than in the access region when the channel of the transistor is fully enhanced, such as when the transistor is biased in the on state. For example, this can be achieved by recessing the semiconductor material of the low-voltage enhancement-mode transistor beneath the gate electrode, i.e., in the gate region of the transistor, as in FIG. 5B, or in some cases by inserting a dielectric material, such as a channel-depleting dielectric, between the gate electrode and the underlying semiconductor material, as in FIG. 5C. Reducing the charge density in the gate region of the low-voltage enhancement-mode transistor when the transistor is in the on state can decrease the maximum current such that the maximum current level of the resulting low-voltage enhancement-mode transistor is substantially less than that of the high-voltage depletion-mode transistor 23. Reducing the charge density in the gate region can be preferable to reducing the gate width, in that it does not increase the access resistance (i.e., the resistance of the device access regions) of the resulting low-voltage enhancement-mode transistor as compared to the conventional low-voltage enhancement-mode transistor, as will be described below. Hence, the total on-resistance of the electronic component may not increase as much as in implementations for which the access resistance of the resulting low-voltage enhancement-mode transistor is made larger.

As used herein, the "gate region" of a transistor refers to the portion of the transistor directly beneath the gate of the transistor, for example the region below gate electrode 32 in FIGS. 5A-5C. As used herein, the "access regions" of a transistor refer to the regions between the source and gate electrodes and between the gate and drain electrodes of the transistor, i.e., regions 52 in FIGS. 5A-5C. As used herein, a "channel-depleting dielectric" is a dielectric material that, when placed between the gate electrode and the semiconductor material layer or layers of a transistor, reduces the amount of negative charge in the transistor channel, for example because the dielectric contains negative charge, or it induces negative charge at the interface between the dielectric and the underlying layer, or through some other mechanism. Examples of insulators that can act as channel-depleting dielectrics include but are not limited to $HfO_2$, $Ta_2O_5$, $ZrO_2$, and AlSiN. In some implementations, a channel-depleting dielectric can be a high-K dielectric, such as $HfO_2$, $Ta_2O_5$, or $ZrO_2$. High-k dielectrics can be dielectric materials with a dielectric constant greater than the dielectric constant of silicon dioxide, such as k>4, but typically have a dielectric constant k>15.

FIGS. 4 and 5 illustrate the implementations described above. FIG. 4 is a plan view of a conventional low-voltage enhancement-mode transistor 22 alongside a low-voltage enhancement-mode transistor 24 of FIG. 3 according to one implementation. As shown, the only substantial difference between the two is that the gate width $W_G$ of transistor 24 is substantially smaller than that of transistor 22. For example, a conventional low-voltage enhancement-mode transistor 22 can be rated to support a voltage of about 40V in the off-state and a current of up to about 100 Amps in the on-state, and can have an on-resistance of about 10 milliohms. Such a device typically has a current density of about 0.3 Amps/mm of gate width, meaning that the total gate width is about 330 mm. When combined with a high-voltage depletion-mode transistor in the configuration of FIG. 1, for the case where the high-voltage depletion-mode transistor is rated to support a voltage of about 600V in the off-state and a current of up to about 70 Amps in the on-state, and has an on-resistance of about 105 milliohms, the total on resistance of the hybrid device would be about 125 milliohms (105 milliohms from the depletion-mode transistor, 10 milliohms from the enhancement-mode transistor, and about 10 milliohms additionally from connections between the transistors) and the maximum current level would be about 70 Amps. If a desired maximum current level of 30 Amps for a device of the same voltage handling capabilities as that described above is desired, then the conventional low-voltage enhancement-mode transistor 22 can be replaced with a transistor 24 having a gate width which is 30% (i.e., about one-third or slightly less than one-third) the gate width of transistor 22 but otherwise being substantially the same as transistor 22. In this case, the on-resistance of transistor 24 would be about 3.3 times that of transistor 22, or about 33 milliohms. The total on-resistance of the resulting hybrid device would thus be about 158 milliohms, which is less than 27% higher than that of the hybrid device which utilizes low-voltage enhancement-mode transistor 22, while the maximum current level of the resulting hybrid device is less than half that of the hybrid device utilizing low-voltage enhancement-mode transistor 22. Furthermore, a typical high-voltage enhancement-mode transistor rated to support a voltage of about 600V in the off-state and a current of up to about 70 Amps in the on-state generally has on on-resistance of about 175 ohms. Hence, the hybrid device 3 of FIG. 3 can have similar voltage blocking capabilities and a substantially lower maximum current level while simultaneously having a lower on-resistance than a conventional high-voltage enhancement-mode transistor.

FIG. 5A is a cross-sectional view of a conventional low-voltage enhancement-mode transistor 22, and FIGS. 5B and 5C are cross-sectional views of low-voltage enhancement-mode transistors 24'/24" according to another implementation. Either of the low-voltage enhancement-mode transistors 24' and 24" can be used for low-voltage enhancement-mode transistor 24 in FIG. 3. As shown in FIGS. 5A and 5B, the difference between transistors 22 and 24' is that the semiconductor layer structure 51 of transistor 24' is recessed beneath the gate electrode 32, i.e., in the gate region of the transistor, while that of transistor 22 is not. In some implementations, the semiconductor layer structure 51 of the conventional low-voltage enhancement-mode transistor 22 and that of the low-voltage enhancement-mode transistor 24' are both recessed in the gate regions, but the recess in transistor 24' is deeper than that in transistor 22 (not shown). Referring to FIGS. 5A and 5C, the difference between transistors 22 and 24" is that transistor 24" includes a channel-depleting dielectric 53 between the gate electrode and the semiconductor layer structure 51, resulting in a lower channel charge density in the gate region of transistor 24" than that of transistor 22 when both are biased in the on state, i.e., when a sufficiently high voltage is applied to the gate electrode relative to the source electrode such that the device is on.

Because low-voltage devices do not need to be able to block high voltages, they typically have on-resistances that are much less than high-voltage devices which are designed to have similar maximum current levels. For example, a low voltage device may have an on-resistance which is at least 3 times smaller, at least 5 times smaller, at least 10 times smaller, or at least 20 times smaller than a high-voltage device designed to have a similar maximum current level to the low-voltage device. Hence, in a hybrid enhancement-mode electronic component such as that of FIG. 3, where the total on-resistance is approximately equal to the sum of the on-resistances of each of the two transistors, increasing the on-resistance of the low-voltage enhancement-mode transistor 24 can still result in a sufficiently low on-resistance for the hybrid enhancement-mode electronic component 3.

For example, consider a hybrid enhancement-mode electronic component in which the low-voltage enhancement-mode transistor has an on-resistance which is one-fifth that of the high-voltage depletion-mode transistor, and both transistors are designed to have the same maximum current level. If the gate width of the low-voltage enhancement-mode transistor were decreased by a factor of 2, the maximum current level of the low-voltage enhancement-mode transistor would also decrease by a factor of 2, and the on-resistance of the low-voltage enhancement-mode transistor would increase by a factor of 2. This would result in a two-fold decrease in the maximum current level of the hybrid enhancement-mode electronic component, while the on-resistance of the hybrid enhancement-mode electronic component only increases by a factor of about 1.17.

Decreasing the charge in the gate region of the low-voltage enhancement-mode transistor, such as with a gate recess or by use of a channel-depleting dielectric as previously described, can decrease the maximum current level of the hybrid enhancement-mode electronic component with an even smaller accompanying increase in the on-resistance, as compared to decreasing the gate width of the low-voltage enhancement-mode transistor. This is because the total on-resistance of the low-voltage enhancement-mode transistor is the sum of the intrinsic on-resistance and the access resistances. While decreasing the gate width by a factor of X increases both the intrinsic on-resistance and the access resistances by a factor of X, decreasing the charge in the gate region increases only the intrinsic on-resistance of the device; the access resistances stay about the same.

The low-voltage enhancement-mode transistor 24 and the high-voltage depletion-mode transistor 23 in FIG. 3 can be any transistors that meet the requirements previously stated. In some implementations, the maximum current level of the low-voltage enhancement-mode transistor 24 is less than 50 A, such as less than 40 or 30 A. In some implementations, the low-voltage enhancement-mode transistor 24 is a silicon device, such as a silicon transistor, FET, or MOSFET (i.e., the semiconductor materials in the device are primarily formed of silicon). In other implementations, the high-voltage depletion-mode transistor 23 is a III-N device, such as a III-N transistor or FET. In yet other implementations, the low-voltage enhancement-mode transistor 24 is a III-N device, such as a nitrogen-face or N-face or N-polar III-N device. A nitrogen-face or N-face or N-polar III-N device can include III-N materials grown with an N-face or [0 0 0 1bar] face furthest from the growth substrate, or can include source, gate, or drain electrodes on an N-face or [0 0 0 1bar] face of the III-N materials.

Figure 6:
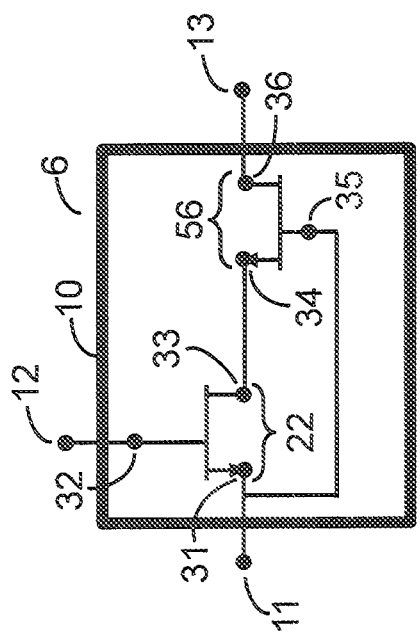
FIG. 6 is a schematic circuit diagram of yet another hybrid transistor device in a package.

FIG. 6 is a circuit diagram of a hybrid enhancement-mode electronic component 6 in which the maximum current level (i.e. short-circuit current) through the component is limited by the design of the high-voltage depletion-mode transistor 56. That is, the high-voltage depletion-mode transistor 56 can have a maximum current level which is smaller (e.g., substantially smaller) than that of the low-voltage enhancement-mode transistor 22, such that the current through the hybrid electronic component is limited to a value that is about equal to or less than the maximum current level of the high-voltage depletion-mode transistor. The hybrid enhancement-mode electronic component 6 of FIG. 6 is a high-voltage device configured to function substantially similarly to a single high-voltage enhancement-mode transistor, as previously described. The hybrid enhancement-mode electronic component 6 includes a low-voltage enhancement-mode transistor 22 and a high-voltage depletion-mode transistor 56, connected as follows. The source electrode 34 of the high-voltage depletion-mode transistor is electrically connected to the drain electrode 33 of the low-voltage enhancement-mode transistor, and the gate electrode 35 of the high-voltage depletion-mode transistor is electrically connected to the source electrode of the low-voltage enhancement-mode transistor 31.

As stated earlier, the total on-resistance of the hybrid electronic component 6 is approximately equal to the sum of the on-resistances of each of the two transistors 22 and 56. Because the high-voltage depletion-mode transistor 56 typically has a much larger on-resistance than the low-voltage enhancement-mode transistor 22, it is desirable to ensure that in designing the high-voltage depletion-mode transistor 56, the on-resistance is not made too high. For example, consider a hybrid enhancement-mode electronic component in which the low-voltage enhancement-mode transistor has an on-resistance which is one-fifth that of the high-voltage depletion-mode transistor, and both transistors are designed to have the same maximum current level. If the gate width of the high-voltage depletion-mode transistor were decreased by a factor of 2, the maximum current level of the high-voltage depletion-mode transistor would also decrease by a factor of 2, and the on-resistance would increase by a factor of 2. This would result in a two-fold decrease in the maximum current level of the hybrid enhancement-mode electronic component 6; however, the on-resistance of the hybrid enhancement-mode electronic component would increase by a factor of about 1.83, which might be too large for the applications in which hybrid electronic components 6 are used. As such, designs for the high-voltage depletion-mode transistor which reduce the maximum current level of the device to the desired value without incurring such a large increase in the device on-resistance may be necessary for some applications.

As stated earlier, because the high-voltage D-mode transistor 56 provides the high-voltage blocking capability of electronic component 6, it will normally have the larger contribution to the on-resistance of the composite device. The on-resistance of high-voltage D-mode transistor 56, however, is often dominated by resistance of a drift region in the drain-side access region which provides the high-voltage blocking capability, rather than by the channel of the high-voltage D-mode transistor 56. Therefore, reducing the effective device width in the region beneath the gate without substantially reducing the device width in the access regions can substantially limit the maximum device current level with only a modest increase in the total on-resistance of the electronic component 6.

Figure 7:
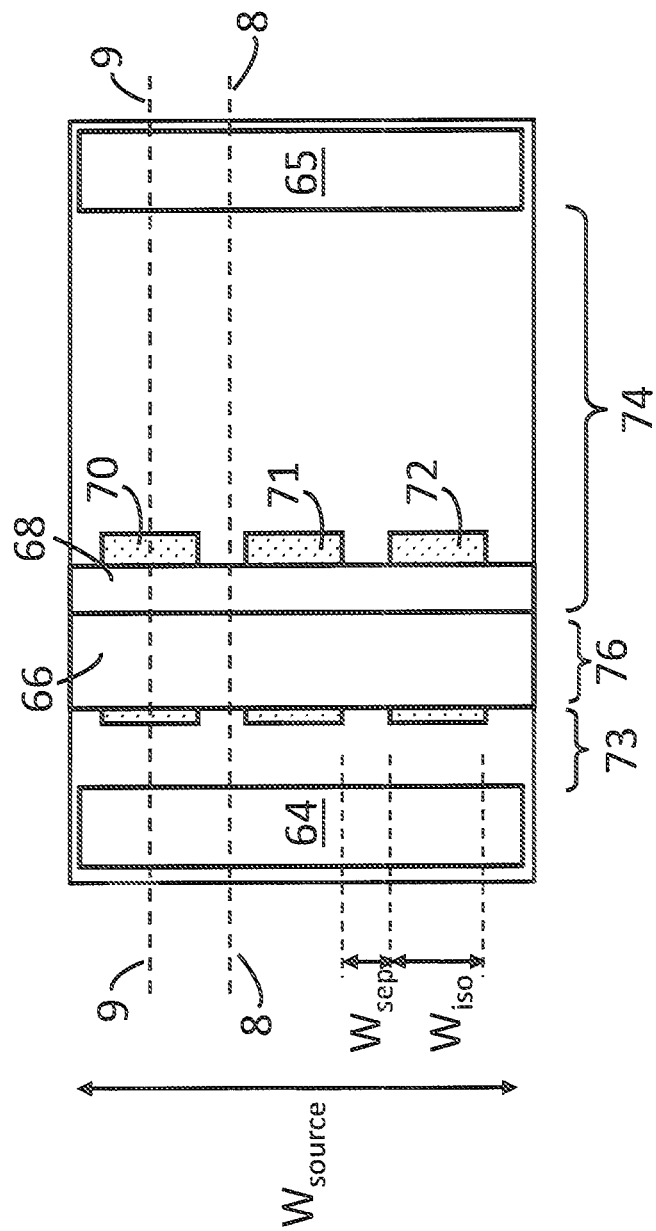
FIG. 7 is a plan view of a transistor having a plurality of isolation regions.
Figure 8:
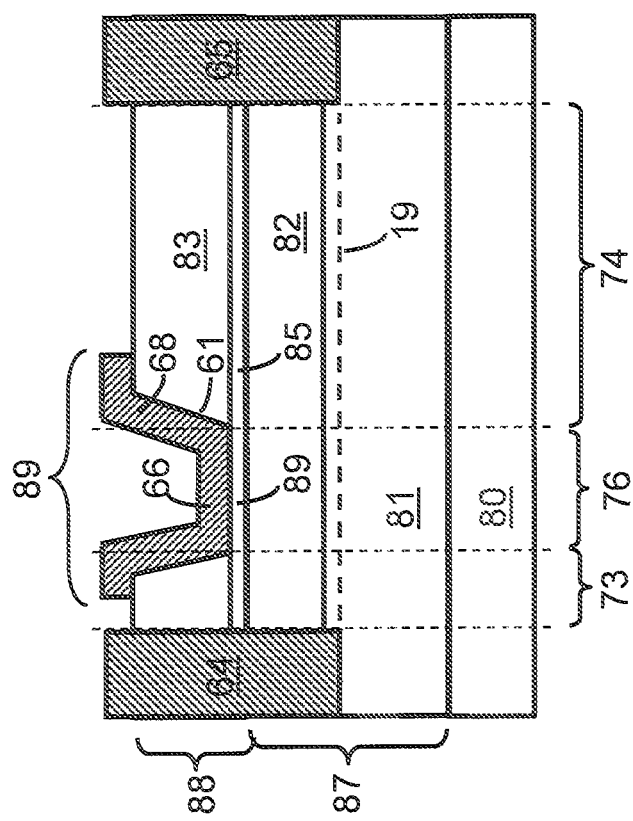
FIG. 8 is a cross-sectional view of the transistor of FIG. 7 along dashed line 8.
Figure 9:
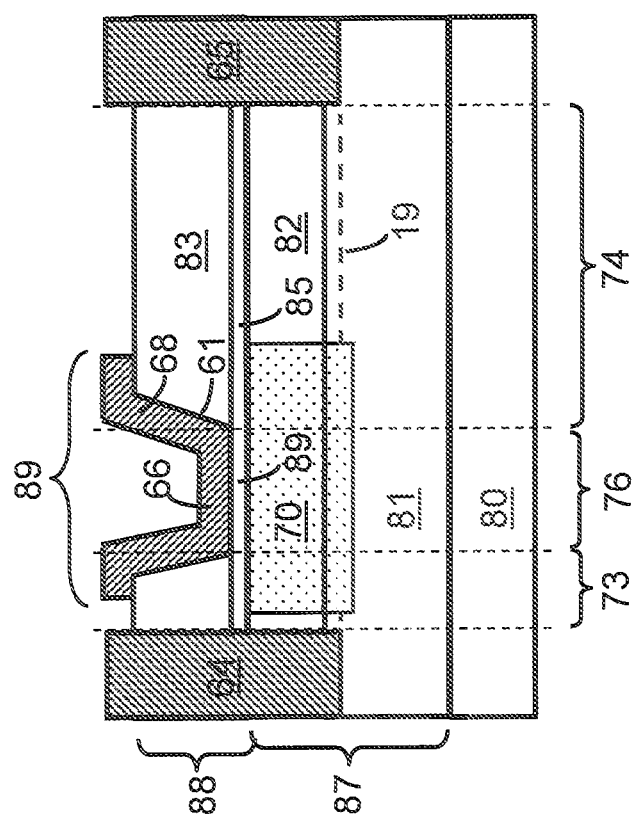
FIG. 9 is a cross-sectional view of the transistor of FIG. 9 along dashed line 8.

FIG. 7 is a plan view (top view) schematic diagram of a high-voltage depletion-mode transistor, i.e., a III-N high electron mobility transistor (HEMT), that can be used for the high-voltage depletion-mode transistor 56 in FIG. 6. FIG. 8 is a cross-sectional view along dashed line 8 in FIG. 7, and FIG. 9 is a cross-sectional view along dashed line 9 in FIG. 7. The transistor of FIGS. 7-9 includes isolation regions 70, 71, and 72 (best seen in FIG. 7) in the III-N material layers 87 (best seen in FIGS. 8-9) between the source 64 and the drain 65. The isolation regions 70-72 reduce the effective device width in the gate region 76 without substantially increasing the resistance in the access regions 73 and 74.

The isolation regions are configured to reduce or minimize the maximum current level (short-circuit current) $I_{max}$ that can flow through the device, while maintaining an acceptably low on-resistance, as further described below. The isolation regions 70-72 form a break in the device channel 19, as best seen in FIG. 9. The isolation regions 70-72 are in the gate region 76 of the III-N material layers 87, and can optionally extend into the source and drain access regions 73 and 74, respectively. In order to effectively limit the current, isolation regions 70-72 may need to at least be under the side of the gate 66 that is closest to the source 64. That is, the isolation regions can each include a first portion which is in the source access region 73 and a second portion which is in the gate region 76, as illustrated in FIG. 9. Optionally, as also illustrated in FIGS. 7 and 9, the isolation regions can also extend into the drain access region 74; that is, they can include a third portion which is in the drain access region 74. In devices with shorter gate lengths, having the isolation regions 70-72 extend into the drain access region 74 can result in the device being more easily manufacturable.

As shown in the cross-sectional views of FIGS. 8 and 9, the transistor device includes a substrate 80 (which may optionally be omitted), a semiconductor material structure 87, and a conductive channel 19, such as a two-dimensional electron gas (2DEG), in the semiconductor material structure 87. The semiconductor material structure 87 includes a III-N channel layer 81 and a III-N barrier layer 82, where the compositions of layers 81 and 82 are selected to induce a 2DEG in the III-N channel layer 81 near the interface between the III-N channel layer 81 and the III-N barrier layer 82. The transistor further includes an insulating material 88, which includes a first insulating material layer 85 and a second insulating material layer 83. Alternatively, insulating material layers could be formed of the same insulating material, such that together they constitute a single material layer. The first insulating material layer 85 includes a gate insulator portion 89 in the gate region 76 beneath the gate 66 of the device, while the second insulating material layer 83 is in access regions 73 and 74 of the device. The transistor also includes a source 64, a drain 65, a gate 66, and a field plate 68. The gate 66 and field plate 68 are shown to be directly connected and together form electrode 89. However, they can alternatively be isolated from one another, such that they are not directly connected.

The slant field plate 68 shown in FIGS. 7-9 is formed of the same conducting material as the gate contact 66. Examples of such conducting materials are Ni, Pt, poly-silicon, Al, Ti, Au, or combinations thereof. Field plates can be used in semiconductor devices, such as transistors, to shape the electric field in the high-field region of the device in such a way that reduces the peak electric field and increases the device breakdown voltage, thereby allowing for higher voltage operation. A field plate does not necessarily need to be formed of the same material as the gate, and it does not necessarily need to be connected to the gate; in some cases, it can be connected to the source, the drain, an electrical ground or a DC voltage source. Insulating material layer 83 (shown in FIGS. 8-9) at least partially defines the geometry of the gate and field plate structures. In the implementation shown in FIGS. 8-9, for example, the insulating material layer 83 includes a slanted edge 61 on the drain side of the gate, and the field plate 68 is on top of and contacting slanted edge 61. Hence the field plate 28 is a "slant field plate". The slanted edge 61 includes at least a substantial portion which is at a non-perpendicular angle to a main surface of the semiconductor material structure 82. Alternative field plate structures to a slant field plate may also be used.

The transistor in FIGS. 7-9 is a lateral device, having source and drain electrodes 64 and 65, respectively, on the same side of the semiconductor material structure 87. However, the transistor could be modified to be a vertical device, in which the drain 65 is on an opposite side of the semiconductor material structure 87 from the source 64. The device may further be any type of field effect transistor, and can be a III-polar (III-face) device, an N-polar (N-face) device, a non-polar, or a semipolar device. A Ga-face, III-face, or III-polar III-N device can include III-N materials grown with a group III-face or [0 0 0 1] face on an opposite side of the III-N materials from the growth substrate, or can include source, gate, and/or drain electrodes on a group III-face or [0 0 0 1] face of the III-N materials. A nitrogen-face, N-face, or N-polar III-N device can include III-N materials grown with an N-face or [0 0 0 1bar] face on an opposite side of the III-N materials from the growth substrate, or can include source, gate, and/or drain electrodes on an N-face or [0 0 0 1bar] face of the III-N materials.

The separation between isolation regions (labeled $W_{sep}$ in FIG. 7) and the width of the hole collector regions (labeled $W_{iso}$ in FIG. 7), relative to the source width (labeled $W_{source}$ in FIG. 7) of the device, determine the maximum current level of the device. That is, if a device which is identical to that of FIGS. 7-9 but lacking the isolation regions 70-72 has a maximum current level $I_0$, the maximum current level of the device of FIGS. 7-9 will equal $I_0*(W_{source}-\Sigma W_{iso})/W_{source}$ (where $\Sigma W_{iso}$ is the sum of the widths of all the isolation regions). Hence, for a given isolation region width $W_{iso}$, if a higher maximum current level is desired, $W_{sep}$ should be made larger, whereas for a smaller maximum current level $W_{sep}$ should be made smaller.

Because each of the isolation regions 70-72 only extend partially into the source access region 73 (and optionally extend partially into the drain access region 74), the source and drain access resistance of the device does not increase as much as in the case where the isolation regions 70-72 extend all the way across the access regions. Hence, while the intrinsic on-resistance of the device increases by a factor $W_{source}/(W_{source}-\Sigma W_{iso})$, the total device on-resistance (which is the sum of the intrinsic and access resistances) increases by a substantially smaller factor.

As previously stated, isolation regions 70-72 form a break in the device channel 19, at least in the gate region 76 of the device. Regions 70-72 can be doped, such as with Al, Mg, or Fe ions, for example by ion-implantation, and may be p-type, nominally p-type, or electrically insulating. Alternatively, in devices in which the channel is a p-type channel (as opposed to the n-type channel shown in FIGS. 8-9), the isolation regions 70-72 can be n-type, nominally n-type, or electrically insulating.

In some implementations, isolation regions 70-72 are also configured to collect holes generated in the device during operation. In such implementations, regions 70-72 may be capable of conducting substantial hole currents, but not substantial electron currents. That is, in some implementations the maximum hole current density that can be conducted through regions 70-72 is at least 100 times the maximum electron current density that can be conducted through regions 70-72. Furthermore, in some implementations, the gate electrode can directly contact the isolation regions 70-72 (not shown in FIGS. 7-9). That is, referring to FIG. 9, an aperture can be etched through gate insulator portion 89 directly over the isolation regions 70-72, such that the gate 66 is deposited in the aperture and directly contacts the underlying III-N semiconductor material.

Figure 10:
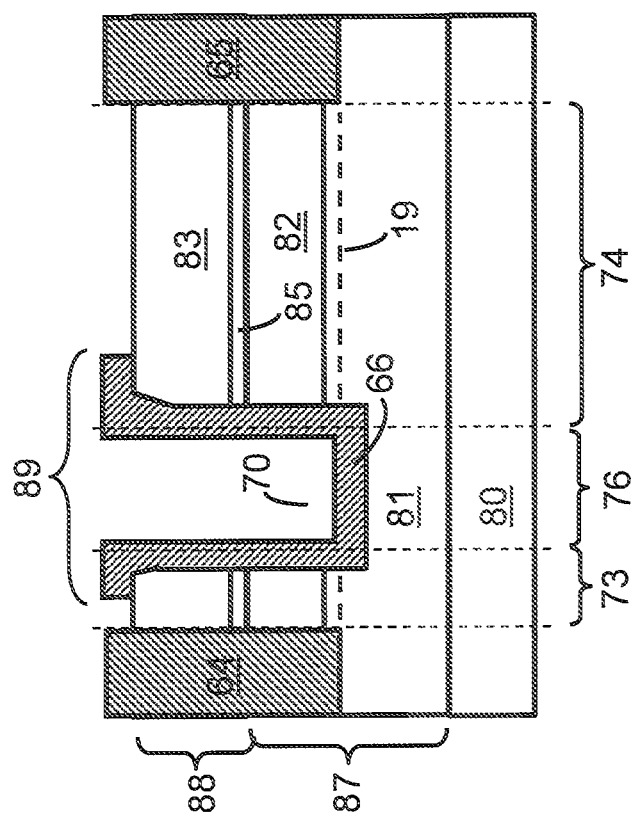
FIG. 10 is an alternative cross-sectional view of the transistor of FIG. 7 along dashed line 9.

FIG. 10 illustrates another implementation of the invention. FIG. 10 is an alternative cross sectional view along dashed line 9 in FIG. 7. As seen in FIG. 10, isolation region 70 (and similarly isolation regions 71 and 72) are formed by etching a recess into the III-N material structure 87, thereby forming a break in the conductive channel 19. As seen in FIG. 10, the recess can extend through 2DEG channel 19, such that it extends all the way through III-N barrier layer 82 and at least partially through III-N channel layer 81. Alternatively, the recess can extend only partially through barrier layer 82 (not shown), but sufficiently deep so that the 2DEG channel 19 is not induced in the isolation regions 70-72 when 0 Volts or less (i.e., a negative voltage) is applied to the gate 66 relative to the source. Furthermore, although in FIG. 10 the electrode 89 is shown to directly contact the III-N material 87 in isolation region 70, an insulating material layer (not shown) can be included in the recess between the III-N material 87 and the electrode 89, such that electrode 89 does not directly contact the underlying III-N material 87 in isolation region 70. For example, in some implementations, one or more of layers 85 and 83 are between electrode 89 and the underlying III-N material 87 in isolation region 70.

Figure 11:
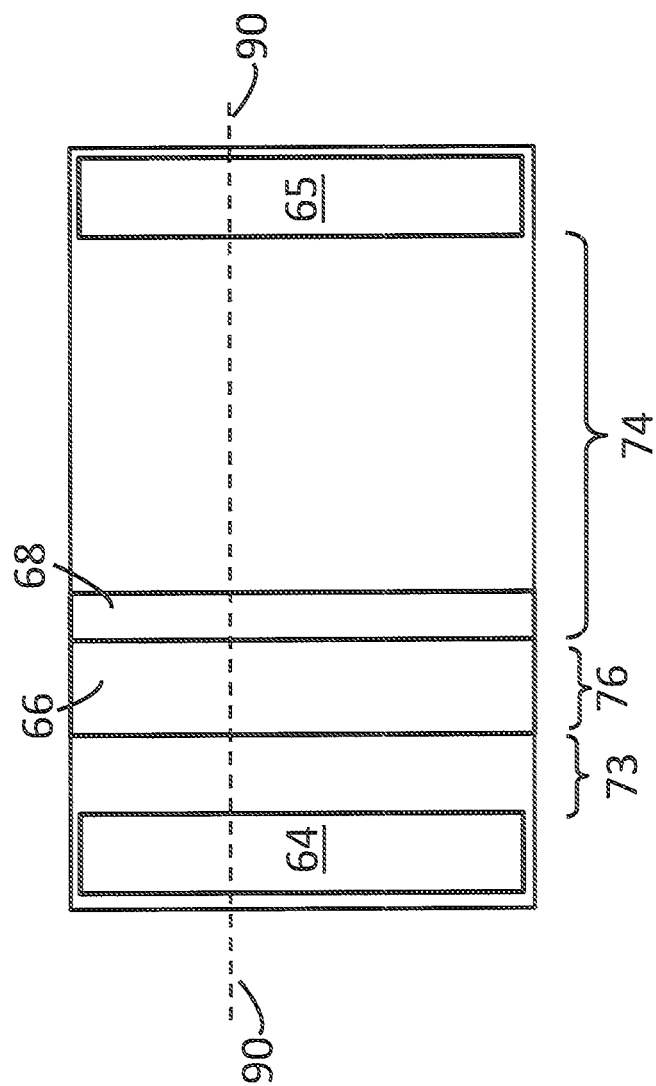
FIG. 11 is a plan view of a transistor device with an integrated current limit.
Figure 12:
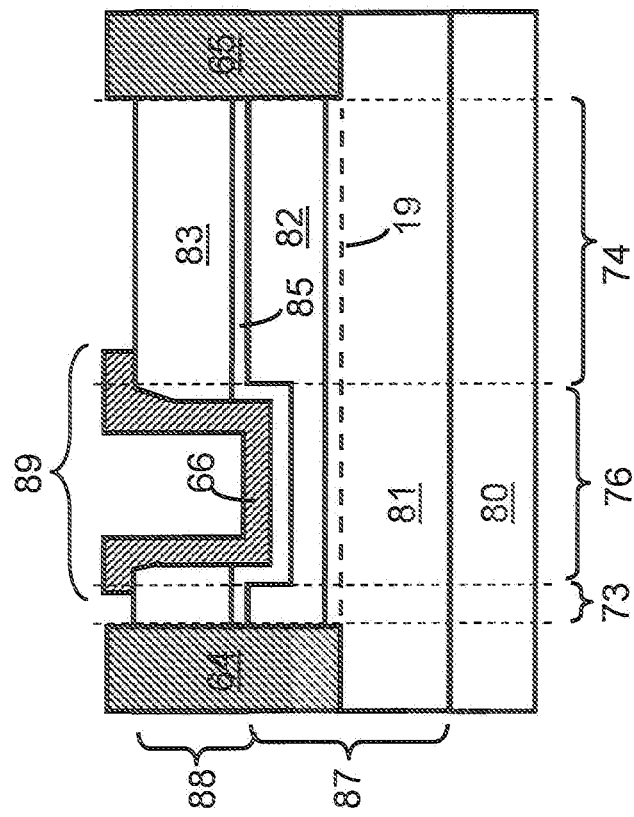
FIG. 12 is a cross-sectional view of the transistor of FIG. 11 along dashed line 90.

Another depletion-mode transistor with an integrated current limit that can be used for transistor 56 in FIG. 6 is shown in FIGS. 11-12. FIG. 11 is a plan view of the device, while FIG. 12 is a cross-sectional view along dashed line 90 in FIG. 11. The device in FIGS. 11-12 is similar to that of FIGS. 7-10, except that isolation regions 70-72 are not included. Instead, III-N barrier layer 82 is recessed in the gate region 76 throughout the device, such that the 2DEG charge density in the gate region 76 is substantially smaller than in the access regions 73 and 74 when 0V or less is applied to the gate 66 relative to the source 64. However, barrier layer 82 is still thick enough in the gate region 76 to induce some 2DEG charge in the gate region at 0V gate bias (relative to the source), such that the device is in the ON state at 0V gate bias.

In the high-voltage depletion-mode transistor of FIGS. 11-12, the charge density or conductivity in the access regions 73 and 74 is greater than that in the gate region 76; hence the maximum current level in the devices can be made as small as desired with only a moderate impact in the on-resistance, since the access resistance is unaffected by the recess. In other implementations, the charge density or conductivity in the gate region 76 can be reduced at 0V gate bias, relative to that in the access regions 73 and 74, using alternative methods to a gate recess. For example, ions such as fluorine ions can be implanted into or included in the III-N barrier layer 82 near the uppermost surface of the III-N material structure 87 in the gate region 76, resulting in a decreased 2DEG charge density in the gate region 76 at 0V gate bias.

A number of implementations have been described. Nevertheless, it will be understood that various modifications may be made without departing from the spirit and scope of the techniques and devices described herein. For example, while high-voltage E-mode operation of electronic components 3 and 6 in FIGS. 3 and 6, respectively, is achieved in part by electrically connecting the gate electrode 35 of D-mode transistor 23/56 to the source electrode 31 of E-mode transistor 24/22, alternative configurations for achieving such operation may be possible as well. For example, electronic components 3 and 6 can each include a resistor (not shown) between gate electrode 35 of D-mode transistor 23/56 and source electrode 31 of E-mode transistor 24/22, in order to reduce the slew rate of the electronic component. In this case, while gate electrode 35 is still electrically coupled (e.g., resistively coupled) to source electrode 31, the two electrodes are not electrically connected. Accordingly, other implementations are within the scope of the following claims.

What is claimed is:

1. An electronic component, comprising:
a depletion-mode transistor having a first breakdown voltage, a first on-resistance, and a first maximum current level, the depletion-mode transistor comprising a source electrode, a gate electrode, and a drain electrode; and
an enhancement-mode transistor having a second breakdown voltage, a second on-resistance, and a second maximum current level, the enhancement-mode transistor comprising a source electrode, a gate electrode, and a drain electrode; wherein
the source electrode of the depletion-mode transistor is electrically connected to the drain electrode of the enhancement-mode transistor and the gate electrode of the depletion-mode transistor is electrically coupled to the source electrode of the enhancement-mode transistor; and
the second on-resistance of the enhancement-mode transistor is less than half the first on-resistance of the depletion-mode transistor, and the second maximum current level is lower than the first maximum current level.

2. The electronic component of claim 1, wherein the second breakdown voltage is smaller than the first breakdown voltage.

3. The electronic component of claim 2, wherein the depletion-mode transistor is a high-voltage device and the enhancement-mode transistor is a low-voltage device.

4. The electronic component of claim 2, wherein the electronic component is configured to function substantially similarly to a single high-voltage enhancement-mode transistor.

5. The electronic component of claim 1, wherein a maximum current level of the electronic component is about the same as or less than the maximum current level of the enhancement-mode transistor.

6. The electronic component of claim 1, wherein the maximum current level of the enhancement-mode transistor is less than half the maximum current level of the depletion-mode transistor.

7. The electronic component of claim 1, wherein the maximum current level of the enhancement-mode transistor is about 35 Amps or less.

8. The electronic component of claim 7, wherein the maximum current level of the depletion-mode transistor is about 60 Amps or more.

9. The electronic component of claim 1, wherein the enhancement-mode transistor is a Silicon device.

10. The electronic component of claim 1, wherein the depletion-mode transistor is a III-N device.

11. The electronic component of claim 10, wherein the enhancement-mode transistor is a Silicon device or a III-N device.

12. The electronic component of claim 1, wherein the gate electrode of the depletion-mode transistor is electrically connected to the source electrode of the enhancement-mode transistor.

13. The electronic component of claim 1, wherein the enhancement-mode transistor further comprises a semiconductor material and includes a channel-depleting dielectric between the semiconductor material and the gate of the enhancement-mode transistor.

14. An electronic component, comprising:
a depletion-mode transistor having a first breakdown voltage and a first maximum current level, the depletion-mode transistor comprising a source electrode, a gate electrode, a drain electrode, a semiconductor material layer including a gate region between the source and drain and a plurality of access regions on opposite sides of the gate region, and a channel in the semiconductor material layer; and
an enhancement-mode transistor having a second breakdown voltage and a second maximum current level, the enhancement-mode transistor comprising a source electrode, a gate electrode, and a drain electrode; wherein
the source electrode of the depletion-mode transistor is electrically connected to the drain electrode of the enhancement-mode transistor and the gate electrode of the depletion-mode transistor is electrically coupled to the source electrode of the enhancement-mode transistor;
the depletion-mode transistor includes one or more isolation regions in the gate region, the one or more isolation regions being configured to reduce the first maximum current level, as compared to a similar device which lacks the one or more isolation regions, without substantially increasing an access resistance of the depletion-mode transistor; and
the first maximum current level is smaller than the second maximum current level.

15. The electronic component of claim 14, wherein the second breakdown voltage is smaller than the first breakdown voltage.

16. The electronic component of claim 14, wherein the depletion-mode transistor is a high-voltage device and the enhancement-mode transistor is a low-voltage device.

17. The electronic component of claim 14, wherein the electronic component is configured to function substantially similarly to a single high-voltage enhancement-mode transistor.

18. The electronic component of claim 14, wherein the depletion-mode transistor is a III-N device.

19. The electronic component of claim 18, wherein the enhancement-mode transistor is a Silicon device or a III-N device.

20. The electronic component of claim 14, wherein the gate electrode of the depletion-mode transistor is electrically connected to the source electrode of the enhancement-mode transistor.

21. The electronic component of claim 14, wherein the one or more isolation regions contain dopants.

22. The electronic component of claim 20, wherein the dopants are selected from the group consisting of Mg, Al, and Fe.

23. The electronic component of claim 14, wherein the one or more isolation regions form a break in the channel.

24. The electronic component of claim 14, wherein the one or more isolation regions comprise a recess formed in the gate region of the semiconductor material layer.

25. The electronic component of claim 24, wherein the recess is formed through the channel.

26. A method of operating the electronic component of claim 14, the method comprising applying a positive voltage to the gate electrode of the enhancement-mode transistor, relative to the source electrode of the enhancement-mode transistor, and applying a substantial positive voltage to the drain electrode of the depletion-mode transistor, relative to the source electrode of the enhancement-mode transistor, causing a maximum current level of the electronic component to flow between the source electrode of the enhancement-mode transistor and the drain electrode of the depletion-mode transistor, wherein the maximum current level of the electronic component is smaller than or equal to the first maximum current level.

27. A method of operating an electronic component, the electronic component comprising:
   a depletion-mode transistor having a first breakdown voltage and a first maximum current level, the depletion-mode transistor comprising a source electrode, a gate electrode, a drain electrode, a semiconductor material layer including a gate region between the source and drain and a plurality of access regions on opposite sides of the gate region, a channel in the semiconductor material layer, and one or more isolation regions in the gate region; and
   an enhancement-mode transistor having a second breakdown voltage and a second maximum current level, the enhancement-mode transistor comprising a source electrode, a gate electrode, and a drain electrode, the source electrode of the depletion-mode transistor being electrically connected to the drain electrode of the enhancement-mode transistor and the gate electrode of the depletion-mode transistor being electrically coupled to the source electrode of the enhancement-mode transistor;
   the method comprising applying a positive voltage to the gate electrode of the enhancement-mode transistor relative to the source electrode of the enhancement-mode transistor, and applying a substantial positive voltage to the drain electrode of the depletion-mode transistor relative to the source electrode of the enhancement-mode transistor, causing a maximum current level of the electronic component to flow between the source electrode of the enhancement-mode transistor and the drain electrode of the depletion-mode transistor, wherein the maximum current level of the electronic component is smaller than or equal to the first maximum current level, and the first maximum current level is smaller than the second maximum current level.

28. The method of claim 27, wherein the one or more isolation regions contain dopants.

29. The method of claim 28, wherein the dopants are selected from the group consisting of Mg, Al, and Fe.

30. The method of claim 27, wherein the one or more isolation regions form a break in the channel.

31. The method of claim 27, wherein the one or more isolation regions comprise a recess formed in the gate region of the semiconductor material layer.

32. The method of claim 31, wherein the recess is formed through the channel.

* * * * *